United States Patent [19]
Skrovan et al.

[11] Patent Number: 6,060,395
[45] Date of Patent: May 9, 2000

[54] PLANARIZATION METHOD USING A SLURRY INCLUDING A DISPERSANT

[75] Inventors: John Skrovan; Karl M. Robinson, both of Boise, Id.

[73] Assignee: Micron Technology, Inc., Boise, Id.

[21] Appl. No.: 09/138,450

[22] Filed: Aug. 21, 1998

Related U.S. Application Data

[63] Continuation of application No. 08/682,147, Jul. 17, 1996, Pat. No. 5,827,781.

[51] Int. Cl.⁷ ..................................................... C09K 13/00
[52] U.S. Cl. ............................................. 438/692; 438/693
[58] Field of Search .................................... 438/690, 691, 438/692, 693

[56] References Cited

U.S. PATENT DOCUMENTS

| | | |
|---|---|---|
| 4,193,226 | 3/1980 | Gill, Jr. et al. . |
| 4,811,522 | 3/1989 | Gill, Jr. . |
| 4,963,283 | 10/1990 | Lapham et al. . |
| 5,290,361 | 3/1994 | Hayashida et al. . |
| 5,366,542 | 11/1994 | Yamada et al. . |
| 5,391,258 | 2/1995 | Brancaleoni et al. . |
| 5,421,769 | 6/1995 | Schultz et al. . |
| 5,759,917 | 6/1998 | Grover et al. ............................ 106/11 |
| 5,827,781 | 10/1998 | Skrovan et al. ........................ 438/692 |
| 5,861,054 | 1/1999 | Miyashita et al. ........................... 106/3 |
| 5,876,490 | 3/1999 | Ronay ......................................... 106/3 |

FOREIGN PATENT DOCUMENTS

| | | |
|---|---|---|
| 3939661 A1 | 6/1991 | Germany . |
| 03256665 A2 | 11/1991 | Japan . |

OTHER PUBLICATIONS

Achuthan et al., "Uniformity of Removal Rate in the CMP of Silicon Dioxide Films," *DUMIC Conference*, 177–179 (1995).

Akiya et al., "Thin–Oxide Dielectric Strength Improvement by Adding a Phosphonic Acid Chelating Agent into $NH_4OH$–$H_2O$ Solution," *J. Electrochem. Soc.*, 141(10), L139–L142 (1994).

Ernsberger, "Attach of Glass by Chelating Agents," *Journal of the American Ceramic Society*, 42(8), 373–375 (1959).

Fang et al., "Determination of the Composition of Viscous Liquid Film on Electropolishing Copper Surface by XPS and AES," *J. Electrochem. Soc.*, 136, 3800–3803 (1989).

*Primary Examiner*—Shrive Beck
*Assistant Examiner*—Bret Chen
*Attorney, Agent, or Firm*—Mueting, Raasch & Gebhardt, P.A.

[57] ABSTRACT

A planarization method includes providing a wafer surface and positioning a pad for contact with the wafer surface. The wafer surface is then planarized using the pad and a slurry. The slurry includes a dispersant which is one of any micellar forming surfactants. Preferably, the dispersant is a diprotic acid having 6 or less carbons connecting the acid groups, more preferably a diphosphonic acid with 4 or less carbon atoms connecting the acid groups, and most preferably is 1,2-ethylenediphosphonic acid (EDP). The wafer surface may be either a nonplanar or a substantially planar wafer surface. Another slurry that can be used in the method includes a slurry component including an abrasive component and a chemically interactive component that interacts with the surface. The slurry component when used alone in a planarization of the surface results in a surface thickness uniformity having a first standard deviation and a first rate of removal of material from the surface. The slurry further includes a dispersant component of a quantity sufficient to reduce the first standard deviation to a second standard deviation lower than the first standard deviation when the planarization of the surface is performed with the slurry including the slurry component and the dispersant component. The planarization of the surface performed with the slurry including the slurry component and the dispersant component has a second rate of removal substantially equivalent to the first rate of removal.

9 Claims, 1 Drawing Sheet

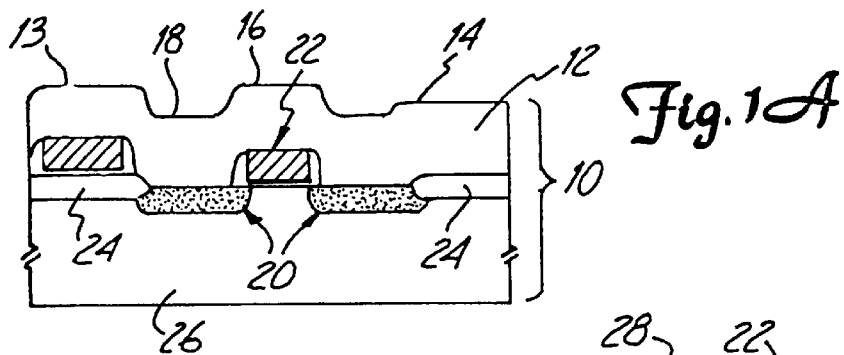
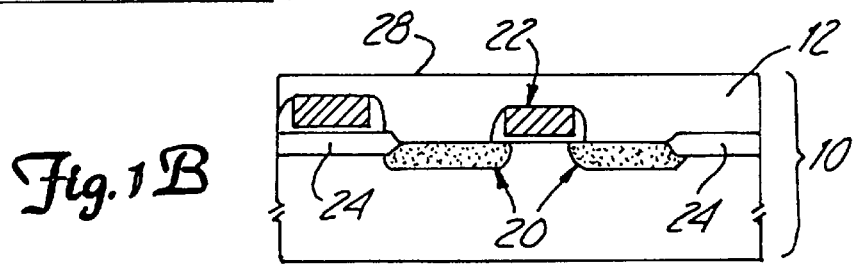
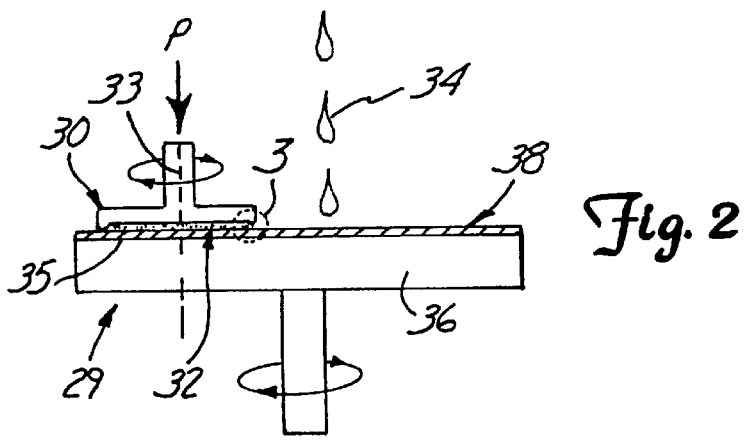
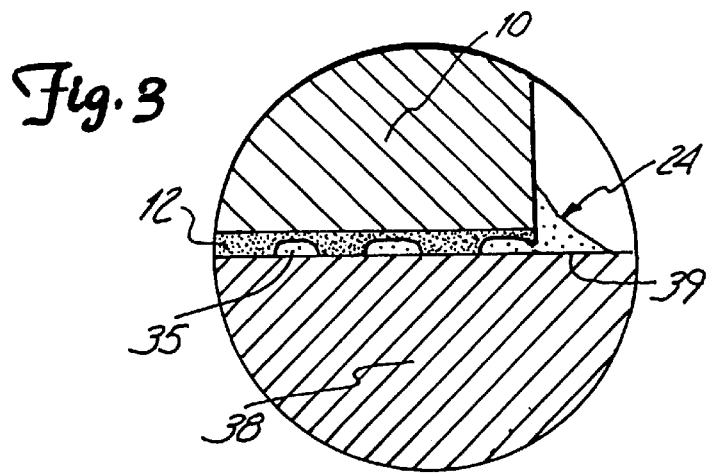

PLANARIZATION METHOD USING A SLURRY INCLUDING A DISPERSANT

This is a continuation of application Ser. No. 08/682,147, filed Jul. 17, 1996, now U.S. Pat. No. 5,827,781 which is incorporated herein by reference.

FIELD OF THE INVENTION

The present invention relates to chemical-mechanical polishing or planarization of surfaces in the fabrication of semiconductor devices. More particularly, the present invention relates to slurries including a dispersant for use in chemical-mechanical polishing or planarization of such surfaces and to methods of using such slurries.

BACKGROUND OF THE INVENTION

During wafer fabrication of semiconductor devices, various surfaces are formed. Many of such surfaces do not have uniform height, and therefore, the wafer thickness is also non-uniform. For example, as is shown in FIG. 1A, the height of the boro-phosphosilicate glass (BPSG) layer 12 of the wafer section 10, does not have the same height at areas 14, 16 and 18. Further, surfaces may have defects such as crystal lattice damage, scratches, roughness, or embedded particles of dirt or dust. For various fabrication processes to be performed, such as lithography and etching, height non-uniformities and defects at the surface of the wafer must be reduced or eliminated. Various planarization techniques are available to provide such reduction and/or elimination. One such planarization technique includes chemical-mechanical polishing (CMP).

The method of CMP is used to achieve a planar surface over the entire chip and wafer, sometimes referred to as "global planarity." Typically, the process of CMP involves a rotating wafer holder that holds a wafer. A slurry is applied to a rotating table or platen which has a polishing pad thereon. The polishing pad is applied to the wafer at a certain pressure to perform the planarization. In some CMP processes, the wafer holder may not rotate, the table or platen may not rotate and/or the platen may be moved in a linear motion as opposed to rotating. There are numerous types of planarization units available which perform the process in different manners.

In many circumstances, even after CMP has been performed, surface nonuniformities of the wafer are present. For example, because of different rotational speeds of the process at the center of the wafer as opposed to the edge of the wafer and different rotational speeds of the rotating table at the center and at the rotating table's periphery, the rate of removal tends to be different across the wafer surface. For example, the removal rate at the edge of the wafer may be higher than at the center of the wafer. Further, for example, the slurry may not be adequately transported to the entire contact area between the wafer and the pad such that further rate of removal differences are created. Slurry transport to the center of the wafer may also be inadequate when the surface is, or becomes as a result of CMP, substantially planar and further planarization is to be performed. This is because no gaps or nonuniformities are available to assist the transport of the slurry to the middle of the contact area.

Nonuniformity of the wafer surface, even after CMP, may be problematic. For example, such nonuniformity may lead to patterning or photolithography problems. Further, such nonuniformity may result in etching at undesirable depths on the wafer surface.

Nonionic surfactants have been added to slurries during CMP in an attempt to enhance uniformity of the material removed from the wafer surface. For example, as described in "Uniformity of Removal Rate in the CMP of Silicon Dioxide Films," by K. Achuthan, et al., DUMIC Conference, Feb. 21–22, 1995, polyethylene oxide (20) stearyl ether (PEO(20)) and polyethylene oxide (10) stearyl ether (PEO (10)) were added to slurries during planarization by CMP. However, the addition of such surfactants reduced the removal rate of the surface material significantly. Reduction of the removal rate is undesirable as it decreases the machine through rate. Further, some surfactants may result in a contaminated surface following cleaning of the surface after CMP is performed.

For the above reasons, improvements in the CMP process are needed to provide adequate uniformity of the planarized surfaces in the wafer fabrication of semiconductor devices. The present invention as described below provides such improvements and overcomes the problems described above and those problems which will become apparent to one skilled in the art from the detailed description provided below.

SUMMARY OF THE INVENTION

The planarization method in accordance with the present invention includes providing a wafer surface and positioning a pad for contact with the wafer surface. The wafer surface is then planarized using the pad and a slurry. The slurry includes a dispersant which is one of any micellar forming surfactants. Preferably the dispersant is a diprotic acid having 6 or less carbons connecting the acid groups, more preferably a diphosphonic acid with 4 or less carbon atoms connecting the acid groups, and most preferably is 1,2-ethylenediphosphonic acid (EDP). The wafer surface may be either a nonplanar or a substantially planar wafer surface.

Another slurry that can be used in the method includes a slurry component including an abrasive component and a chemically interactive component that interacts with the surface. The slurry component when used alone in a planarization of the wafer surface results in a wafer thickness uniformity having a first standard deviation and a first rate of removal of material from the wafer surface. The slurry further includes a dispersant component of an amount sufficient to reduce the first standard deviation to a second standard deviation lower than the first standard deviation when the planarization of the wafer surface is performed with the slurry including the slurry component and the dispersant component. The planarization of the wafer surface performed with the slurry including the slurry component and the dispersant component has a second rate of removal at least substantially equivalent to the first rate of removal.

In another embodiment of the method, the slurry is transported to the center of the contact area between the wafer surface and the pad during the planarization step such that the slurry is substantially uniformly distributed over the contact area.

BRIEF DESCRIPTION OF THE FIGURES

FIG. 1A and 1B are cross-sectional illustrations or a part of a wafer before and after a planarization process has been performed in accordance with the present invention;

FIG. 2 is a general diagrammatical illustration of a chemical-mechanical polishing or planarization apparatus utilized in accordance with the present invention; and FIG. 3 is an enlarged view of a portion of the dashed circle area of FIG. 2.

DESCRIPTION OF THE PREFERRED EMBODIMENTS

FIG. 1A illustrates a portion of a wafer 10 prior to planarization by chemical-mechanical polishing (CMP) in accordance with the present invention. The wafer portion 10 includes a substrate 26 having junctions 20 formed thereon. Isolation areas 24 are also formed on substrate 26 with polysilicon 22 deposited thereon. Over these elements formed on substrate 26, a film of borophosphosilicate glass (BPSG) 12 is formed, and, such as by reflow, the glass 12 conformably covers steps, fills gaps between polysilicon lines, and forms an upper surface having different heights such as at areas 14, 16, and 18. The nonplanar upper surface 13 of BPSG film 12 is the surface having non-uniformities which can be reduced or eliminated when subjected to planarization in accordance with the present invention.

FIG. 1A is shown only to illustrate a surface having nonuniformities, such as height differences, in the fabrication of semiconductor devices. Other surfaces, including but not limited to other dielectrics, polysilicon, oxide filled trenches, various metal films, other doped oxides, spin on glasses, or any other fabricated surface which may require planarization as is known to one skilled in the art may benefit from the present invention. Therefore, the present invention is not limited to the planarization of any particular surface, but is limited only in accordance with the invention as described in the accompanying claims.

FIG. 1B illustrates the wafer portion 10 shown in FIG. 1A after the upper surface 13 of the BPSG film 12 has been planarized in accordance with the present invention. The resulting wafer 10 includes an upper surface 28 planarized or polished such that the thickness of the wafer 10 is substantially uniform across the entire wafer 10. As will be described further below, the present invention provides for a more uniform thickness across the wafer. The more uniform thickness of the wafer having the surface formed using a slurry including a dispersant as described herein has a standard deviation substantially less than the standard deviation of wafers having surfaces planarized with the use of a slurry not including the dispersant as described herein.

The present invention is not limited to use with nonplanar surfaces, such as that shown in FIG. 1A. The present invention is also beneficial for use with substantially planar surfaces such as the surface 28 shown in FIG. 1B. For example, the slurry and method of planarization in accordance with the present invention is beneficial during the whole planarization process, even at the end of the process when the surface being planarized is in a substantially planar state. In fact, the present invention provides substantial benefit for substantially planar surfaces as the slurry of the present invention is transported more uniformly in the contact area between the pad and the wafer even though there are no nonuniformities to assist the transport of the slurry when the surface is substantially planar. As such, the benefits are applicable to both nonplanar and planar surfaces and furthermore through the entire planarization process.

FIG. 2 is a diagrammatical illustration showing the CMP process for planarization of surfaces of semiconductor wafers in accordance with the present invention. As shown in FIG. 2, the present invention utilizes a planarization assembly 29 such as Model 372 or Model 472 available from Westech Systems, Inc. Other planarization assemblies or units for performing CMP methods are readily available and are clearly contemplated by the scope of the present invention as described in the accompanying claims. For example, the planarization process may be performed with the apparatus described in U.S. Pat. No. 5,421,729, entitled "Apparatus For Planarizing Semiconductor Wafers, and a Polishing Pad for a Planarization Apparatus" and herein incorporated by reference; U.S. Pat. No. 4,193,226 entitled "Polishing Apparatus" and herein incorporated by reference; U.S. Pat. No. 4,811,522 entitled "Counterbalanced Polishing Apparatus" and herein incorporated by reference; and any other planarization assembly as known to those skilled in the art.

The generally illustrated planarization assembly, as shown in FIG. 2, for performing CMP in accordance with the present invention, includes a rotating wafer holder or carrier 30 that holds wafer 32 of which wafer portion 10 is a part thereof. A slurry 34 in accordance with the present invention is introduced atop a polishing pad 38. The polishing pad 38 is located on a rotating table or platen 36. The polishing pad 38 is applied to the surface 12 of wafer 10 in the presence of the slurry 34 at a certain pressure to perform the planarization as is shown in the detail drawing of FIG. 3 The pressure applied is represented in FIG. 2 by the arrow mark "P"; this pressure P represents both down force pressure and backside pressure applied per a planarization assembly, such as an assembly available from Westech Systems, Inc. The rotating elements 30, 36 are rotated and moved by motors or drive means (not shown) as is readily known to those skilled in the art.

Wafer holder or carrier 30 rotates wafer 32 at a selected velocity about an axis 33 and moves wafer 32 under controlled pressure P across pad 38. The wafer 32 contacts the pad 38 as it is moved. The area of the pad 38 which comes into contact with the surface 12 of the wafer 32 varies as the wafer 32 is moved as is known to those skilled in the art.

A chemical supply system (not shown) introduces a slurry 34 atop the pad 38 at a specified flow rate. The slurry 34 may be introduced at various locations about the pad without affecting the benefits of the present invention. For example, the slurry 34 may be introduced from above the pad 38, such as by drip, spray, or other dispensing means and further may be introduced from beside the rotating table 36 by spraying or other dispensing means.

The rotating table or platen 36 is rotated at a selected velocity and is rotated in the same direction as the wafer holder 30. The surface 12 of the wafer 32 is held in juxtaposition relative to the pad 38 so that the pad 38 can planarize or polish surface 12. The difference between the velocity of the wafer surface 12 at the center or axis 33 of the wafer 32 and the velocity outward toward the periphery of the wafer 32 lead to different removal rates at different areas of the surface 12. In addition, the velocity differences between the rotating pad at the center thereof and toward the periphery also may lead to different removal rates of the surface material at different areas of the wafer surface 12. Furthers although the slurry composition and the pad pressure primarily determine the polishing rate or rate of removal of the surface material, the rate of removal is not the same or uniform across the entire wafer surface if the slurry is not uniformly distributed in the contact area 35 between the wafer surface 12 and the pad 38.

To alleviate nonuniformity resulting from the different rates and nonuniform slurry distribution, the present invention performs planarization in the presence of a slurry having a dispersant that allows the slurry to be transported substantially uniformly in the contact area 35 between the wafer surface 12 and the pad 38, particularly to the center of the contact area. The slurry in accordance with the present invention includes a conventional slurry component and a dispersant component added thereto.

The conventional slurry component generally includes an abrasive component and a component that chemically interacts with the surface 12. For example, a typical oxide polishing slurry may consist of a colloidal suspension of oxide particles, with an average size of 30 nm, in an alkali solution having a pH greater than or equal to about 9. Ceria ($CeO_2$) suspensions may also be used when appropriate, particularly where large amounts of $SiO_2$ must be removed. Ceria acts as both the chemical and mechanical agent in the slurry. Other abrasive components of the slurry component may include, but are not limited to, alumina ($AlO_3O_2$) silica, titania ($TiO_2$), or any other abrasive used in conventional planarization slurries as is known to one skilled in the art.

Several slurry solutions presently available include ILD1300, an aqueous colloidal silica slurry including amorphous silica and ammonium hydroxide, available from Rodel, Inc., Newark, Del., and SC-1, a colloidal fumed silica aqueous slurry including amorphous silicon dioxide, DI water, and potassium hydroxide, available from Cabot Corp., Tuscola, Ill., under the trade designation CAB-O-SPERSE SC-1. General characteristics of suitable conventional slurry components utilized in conjunction with the present invention include that the hardness of the polishing particles or abrasive component should be about the same hardness as the hardness of the film being polished to avoid damaging the film. In addition, the particles should be uniform and-the solution should be generally free of metallic contaminants. Further, for example, conventional planarization slurries having a pH greater than about 9 are used for oxide polishing processes and those less than a pH of about 4 are used for polishing processes of, for example, tungsten. The conventional slurry used is dependant upon the type of surface being polished.

A suitable dispersant component added to the conventional slurry component to form the slurry 34 in accordance with the present invention should have the ability to reduce the viscosity of the conventional slurry component to allow transport of the slurry 34 toward the center of the contact area between the wafer surface 12 and pad 38. Further, a suitable dispersant should not result in contamination of the surface after a cleaning procedure has been performed, such as an HF vapor clean, or any other cleaning processes used in the appropriate circumstances as would be known to one skilled in the art. Moreover, a suitable dispersant should not substantially reduce the overall rate of removal of the surface material from the wafer surface.

A suitable dispersant may include any micellar forming surfactant. In other words, the surfactants must be capable of forming aggregates of molecules or ions referred to as micelles in the slurry of the CMP process. This micelle formation must be capable of being performed in ambient temperature of the CMP process, typically 60° F. to about 140° F., and at the pH of the slurry used, typically either less than about 4 or greater than about 9. The micellar forming surfactant must have limited solubility, i.e. it must not be totally soluble in the CMP slurry or it could not function as a surfactant or a dispersant. Further, the surfactant should have limited buffering affect on the slurry, i.e. it must not be of such a quantity as to affect the slurry pH such that the slurry can no longer function properly as a planarization slurry for the surface being planarized. In order to form micelles, the surfactant must be of a concentration in the slurry that exceeds the critical micelle concentration (CMC). Generally, short chained surfactants have lower CMC values and thus a lesser concentration of the surfactant in the slurry allows the surfactant to function as a dispersant. Such short chain surfactants include short chain organic acids. For example, an oxylate is such a short chain micellar forming surfactant.

Preferably the dispersant is a short chain diprotic acid having low hydrophobicity with 6 or less carbons connecting the acid groups. More preferably, the dispersant is a diphosphonic acid with 4 or less carbon atoms connecting the acid groups. Most preferably, the dispersant is 1,2-ethylenediphosphonic acid (EDP) available from Lancaster Synthesis Ltd., Windham, N.H.

The dispersants, such as EDP, increase the shear viscosity of the slurry 34 to allow transport of the slurry 3-effectively from the edge 39 of the wafer surface 12 (FIG. 3) towards the center of the contact area between the wafer 32 and pad 38 at axis 33. As the slurry 34 is more uniformly distributes in the contact area, the differences in rate of removal at different areas of the wafer surface 12 are reduced resulting in a more uniform wafer surface. Use of EDP, in particular, does not result in contamination after a clean has been performed and further, the overall rate of removal of surface material is not substantially reduced by use of EDP. The resulting wafer has a standard deviation in thickness which is substantially less than when the dispersant is not utilized as is shown in the Examples below.

The benefits of using the dispersant are not affected by the type or material of the polishing pad utilized. For example, the slurry may be utilized with any known and appropriate polishing pad as would be known to one skilled in the art because the choice of pads is application dependant. For example, suitable pads may include pads such as Model No. IC 1000, Model No. IC 60 and Polytech pads all available from Rodel, Inc., Scottsdale, Ariz. The polishing pad 38 may include one or more pads; may be of specific shape, i.e. circular, oval, or rectangular; may be of a nonuniform shape; and may be of any particular hardness depending on the particular application.

Preferably, the amount of dispersant utilized is in the range of 0.001 grams to about 20 grams per 5000 ml of slurry component. More preferably, the amount of dispersant is in the range of 0.01 grams to about 5 grams per 5000 ml of slurry component. As shown in the Examples below, 0.3 grams of EDP per 5000 ml of slurry component, 0.2 grams of EDP per 2 gallons of slurry component, and 3 grams of EDP per 5000 ml of slurry component have been shown to improve uniformity of the wafer surface.

Example 1

In this Example 1, four wafers were subjected to planarization and one wafer was left unplanarized for a control wafer. The results show that when EDP was utilized as a dispersant component in a conventional slurry for the CMP process, better uniformity of the wafer surface is achieved without a substantial reduction of overall removal rate. The CMP process was performed using a Westech CMP planarization unit, Model 372, available from Westech Systems, Inc. All the wafers; other than the control wafers, were planarized for 1 minute and 53 seconds. Whenever the conventional slurries were utilized with EDP, the slurry included 2 grams of EDP per 5000 ml of conventional slurry. The wafers undergoing planarization were all run with a 5 psi downforce pressure utilizing the wafer holder, a 2 psi backside pressure utilizing the wafer table, a 100 ml/mm flowrate of the slurry, platen rotation at 33 rpm, holder or carrier rotation at 28 rpm, and a wafer table or platen temperature of about 115° F. All of the wafers were silicon wafers having BPSG deposited thereon; the BPSG layers being doped equally for each wafer. Between the planarization of each wafer, a pad conditioning step was performed which includes running a diamond studded disc across the pad, for a time period of about 75 seconds, to refresh the pad surface.

The following Table 1 provides the results for this Example 1.

TABLE 1

| Wafer No. | Pads | EDP added | Slurry | Mean Wafer Thickness (Å) | Range (Å) | % STD |
|---|---|---|---|---|---|---|
| 1 | IC 60 | No | SC-1 | 3381 | 1318 | 11.6 |
| 2 | IC 60 | No | SC-1 | 3337 | 1180 | 10.4 |
| 3 | IC 60 | Yes | SC-1 | 4168 | 818 | 4.7 |
| 4 | IC 60 | Yes | SC-1 | 3282 | 768 | 5.7 |
| 5-control | control | control | control | 12667 | 543 | .95 |

The measurements of the wafers were taken utilizing a Model UV 1050 Tester, available from Prometrics, Inc. Prior to measurements, the wafers were cleaned with a DI rinse. The mean thickness of the planarized wafer was calculated based on 49 data measurement points across the wafer; with the range (maximum thickness measurement minus minimum thickness measurement) and standard deviation also calculated from such data. The control wafer-5 was left unplanarized.

The results above, particularly the standard deviations and the range, show that substantial improvement in uniformity is achieved with the use of EDP in the conventional slurry. As shown, the standard deviation decreased showing improved uniformity. Further, the range, which typically coincides with a maximum measurement at the center of the wafer minus a minimum measurement at the edge of the wafer, i.e. a center to edge measurement, also decreased showing that uniformity is improved and that it is likely that the slurry is being transported to the center of the wafer during planarization more effectively to improve center of the wafer planarization. It is also shown from the mean thickness of the wafers that the rate of removal was not substantially reduced.

Example 2

In this Example 2, eight wafers were subjected to planarization and one wafer was left unplanarized for a control wafer. The results that when EDP was utilized as a dispersant component in a conventional slurry for the CMP process, better uniformity of the wafer surface is achieved independent of polish pad type and without a substantial reduction of overall removal rate. The CMP process was performed using a Westech CMP planarization unit, Model 472. available from Westech Systems, Inc. All the wafers, other than the control wafers, were planarized for 20 seconds. When the conventional slurries were utilized with EDP, the slurry included 0.2 grams of EDP per 2 gallons of conventional slurry. The wafers undergoing planarization were all run with a 5 psi downforce pressure utilizing the wafer holder or carrier, 2 psi backside pressure utilizing the wafer table or platen, platen rotation at 33 rpm, carrier or holder rotation at 28 rpm, a 100 ml/mm flowrate of the slurry, and a wafer table or platen temperature of about 115° F. All of the wafers were silicon wafers having BPSG deposited thereon; the BPSG layers being doped equally for each wafer. Between the planarization of each wafer, a pad conditioning step was performed which includes running a diamond studded disc across the pad for a time period of about 75 seconds, to refresh the pad surface.

The following Table 2 provides the results for this Example 2.

TABLE 2

| Wafer No. | Pads | EDP added | Slurry | Mean Wafer Thickness (Å) | Range (Å) | % STD |
|---|---|---|---|---|---|---|
| 1 | IC 1000 | No | ILD 1300 | 1656.2 | 706.6 | 10.324 |
| 2 | IC 1000 | Yes | ILD 1300 | 1912 | 701.9 | 8.172 |
| 3 | IC 60 | No | ILD 1300 | 1795.3 | 653.8 | 8.52 |
| 4 | IC 60 | Yes | ILD 1300 | 1964 | 410.4 | 4.48 |
| 5 | IC 1000 | No | SC-1 | 1595.6 | 711.10 | 10.917 |
| 6 | IC 1000 | Yes | SC-1 | 2113 | 376.8 | 3.55 |
| 7 | IC 60 | No | SC-1 | 2060.5 | 382.3 | 3.92 |
| 8 | IC 60 | Yes | SC-1 | 2070.4 | 312.3 | 3.2 |
| 9-Control | Control | Control | Control | 2877 | 145.7 | 1.41 |

The measurements of the wafers were taken utilizing a Model UV 1050 Tester, available from Prometrics, Inc. The average thickness of the planarized wafers was calculated based on 5 data points across the wafer and the range and standard deviation were also calculated from such data. The control wafer-9 was left unplanarized.

The results above, particularly the standard deviations and the range, show that substantial improvement in uniformity is achieved with the use of EDP in the conventional slurry, independent of whether the slurry was ILD 1300 or SC-1 and also independent of whether the pads were IC 60 or IC 1000 pads. The standard deviation and the range decreased with the addition of EDP and thus indicate improved uniformity. It is also shown from the mean thickness of the wafers that the rate of removal was not substantially reduced by the addition of EDP to the conventional slurry component.

Example 3

In this Example 3, thirteen (13) wafers were subjected to planarization. The thirteen wafers were split into three groups. The first group of four wafers was planarized using a slurry including 0.3 grams of EDP per 5000 ml of slurry component, ILD 1300. The second group of four wafers was planarized using a slurry including 3 grams of EDP per 5000 ml of slurry component, ILD 1300. Last, the third group of five wafers was planarized using just the slur component, ILD 1300, for control purposes.

A start to middle planarization, and then a middle to final planarization, was performed for each wafer. The start to middle planarization was performed for 3 minutes for each wafer and the middle to final planarization was performed for an additional 1.5 minutes, for a total planarization time of 4.5 minutes. Measurements of the wafers were taken after the start to middle planarization and also after the middle to final planarization as are shown by the data in Tables 3–9.

The results show that when EDP was utilized as a dispersant component in a conventional slurry for the CMP process, better uniformity of the wafer surface is achieved without a substantial reduction of overall removal rate. Further, it is shown that the planarization of the wafers is beneficial for latter periods in the process when the wafer surface is somewhat more planar than at the beginning of the planarization process. In addition, the amount or EDP, 0.3 grams versus 3 grams, did not lead to substantially different results.

With respect to each wafer, the CMP process was performed using a Westech CMP planarization unit, Model 372, available from Westech Systems, Inc. The wafers undergoing planarization were all run with a 5 psi downforce pressure utilizing the wafer holder or carrier, a 2 psi backside pressure of utilizing the wafer table or platen, platen rotation at 33 rpm, carrier rotation at 28 rpm a 100 ml/mm flowrate of the slurry, and a wafer table or platen temperature of about 115° F. All of the wafers were silicon wafers having BPSG deposited thereon; the BPSG layers being doped equally for each wafer. Between the planarization of each wafer, a pad conditioning step was performed which includes running a diamond studded disc across the pad, for a time period of about 75 seconds, to refresh the pad surface.

The measurements of the wafers were taken utilizing a Model UV 1050 Tester, available from Prometrics, Inc. The average thickness of the removed material of planarized wafers was calculated based on 5 data points across the wafer and the range (difference between maximum measured amount removed and minimum amount removed) and standard deviation was calculated from such data.

The following Tables 3–9 provide the resulting data for this Example 3. Table 3 shows the results of planarization of each wafer for the 4 minute start to mid planarization.

Table 5 shows the results of planarization of each wafer for the 1.5 minute additional mid to final planarization.

TABLE 5

Mid to Final Planarization (1.5 Minutes)

| Wafer No. | Pads | Amount of EDP added per 5000 ml | Slurry | Mean of Thickness Removed (Å) | Range (Å) | % STD |
|---|---|---|---|---|---|---|
| 1 - Group 1 | IC 1000 | None | ILD 1300 | 4488 | 1180 | 7.34 |
| 2 - Group 1 | IC 1000 | None | ILD 1300 | 4209 | 1051 | 7.95 |
| 3 - Group 1 | IC 1000 | None | ILD 1300 | 4186 | 1319 | 9.2 |
| 4 - Group 1 | IC 1000 | None | ILD 1300 | 4300 | 1155 | 8.57 |
| 5 - Group 1 | IC 1000 | None | ILD 1300 | 4175 | 1142 | 9.26 |
| 6 - Group 2 | IC 1000 | .3 grams | ILD 1300 | 4363 | 1065 | 8.2 |
| 7 - Group 2 | IC 1000 | .3 grams | ILD 1300 | 4424 | 1088 | 8.2 |
| 8 - Group 2 | IC 1000 | .3 grams | ILD 1300 | 4666 | 1141 | 6.9 |
| 9 - Group 2 | IC 1000 | .3 grams | ILD 1300 | 4658 | 879 | 6 |
| 10 - Group 3 | IC 1000 | 3 grams | ILD 1300 | 4527 | 1061 | 6.92 |
| 11 - Group 3 | IC 1000 | 3 grams | ILD 1300 | 4528 | 1323 | 6.92 |
| 12 - Group 3 | IC 1000 | 3 grams | ILD 1300 | 4526 | 1161 | 8.35 |
| 13 - Group 3 | IC 1000 | 3 grams | ILD 1300 | 4667 | 1143 | 7.3 |

TABLE 3

Start to Mid Planarization (3 Minutes)

| Wafer No. | Pads | Amount of EDP added per 5000 ml | Slurry | Mean of Thickness Removed (Å) | Range (Å) | % STD |
|---|---|---|---|---|---|---|
| 1 - Group 1 | IC 1000 | None | ILD 1300 | 3020 | 2594 | 28.2 |
| 2 - Group 1 | IC 1000 | None | ILD 1300 | 2746 | 2130 | 26.2 |
| 3 - Group 1 | IC 1000 | None | ILD 1300 | 2696 | 2725 | 34.8 |
| 4 - Group 1 | IC 1000 | None | ILD 1300 | 2663 | 3168 | 33.5 |
| 5 - Group 1 | IC 1000 | None | ILD 1300 | 2633 | 2352 | 26.9 |
| 6 - Group 2 | IC 1000 | .3 grams | ILD 1300 | 2672 | 2791 | 32.3 |
| 7 - Group 2 | IC 1000 | .3 grams | ILD 1300 | 2911 | 2378 | 25 |
| 8 - Group 2 | IC 1000 | .3 grams | ILD 1300 | 3458 | 3454 | 27.5 |
| 9 - Group 2 | IC 1000 | .3 grams | ILD 1300 | 3396 | 2942 | 25.2 |
| 10 - Group 3 | IC 1000 | 3 grams | ILD 1300 | 3116 | 3076 | 28.7 |
| 11 - Group 3 | IC 1000 | 3 grams | ILD 1300 | 3185 | 2574 | 24 |
| 12 - Group 3 | IC 1000 | 3 grams | ILD 1300 | 3303 | 2773 | 25.6 |
| 13 - Group 3 | IC 1000 | 3 grams | ILD 1300 | 3659 | 2566 | 25.1 |

Table 4 shows the results of Table 3 averaged by group number. As is shown by the decrease in percent standard deviation, the uniformity of the planarized wafer surface is improved by the addition of EDP in the slurry. Further, as indicated by the average thickness removed, the rate of removal over this period of time was not reduced by the addition of EDP to the slurry, but rather was actually increased.

TABLE 4

Start to Mid Planarization (3 Minutes) - Group Averaged

| Wafer Group No. | Pads | Amount of EDP added per 5000 ml | Slurry | Average Average Thickness Removed (Å) | Range (Å) | % STD |
|---|---|---|---|---|---|---|
| Group 1 | IC 1000 | None | ILD 1300 | 2752 | 2594 | 29.9 |
| Group 2 | IC 1000 | .3 grams | ILD 1300 | 3109 | 2891 | 27.5 |
| Group 3 | IC 1000 | 3 grams | ILD 1300 | 3316 | 2747 | 25.9 |

Table 6 shows the results of Table 5 averaged b) group number. As is shown by the decrease in percent standard deviation from the control group standard deviation, the uniformity of the planarized wafer surface is improved by the addition of EDP in the slurry. Further, as indicated by the average thickness removed, the rate of removal over this period of time was not reduced by the addition of EDP to the slurry, but rather the rate of removal was actually increased.

TABLE 6

Mid to Final Planarization (1.5 Minutes) - Group Averaged

| Wafer Group No. | Pads | Amount of EDP added per 5000 ml | Slurry | Average Thickness Removed (Å) | Average Range (Å) | % STD |
|---|---|---|---|---|---|---|
| Group 1 | IC 1000 | None | ILD 1300 | 4272 | 1169 | 8.5 |
| Group 2 | IC 1000 | .3 grams | ILD 1300 | 4528 | 1043 | 7.3 |
| Group 3 | IC 1000 | 3 grams | ILD 1300 | 4562 | 1172 | 7.7 |

Table 7 shows this rate of removal being increased with the addition of the EDP to the slurry for the 1.5 minute planarization.

TABLE 7

Mid to Final Group Average Polish Rate (1.5 Minutes)

| Wafer Group No. | Pads | Amount of EDP added per 5000 ml | Slurry | Polish Rate (Å/min) |
|---|---|---|---|---|
| Group 1 | IC 1000 | None | ILD 1300 | 2847 |
| Group 2 | IC 1000 | .3 grams | ILD 1300 | 3019 |
| Group 3 | IC 1000 | 3 grams | ILD 1300 | 3041 |

Table 8 shows the results of planarization of each wafer for the entire planarization time period of 4.5 minutes.

TABLE 8

Start to Final Planarization (4.5 Minutes)

| Wafer No. | Pads | Amount of EDP added per 5000 ml | Slurry | Average Thickness Removed (Å) | Range (Å) | % STD |
|---|---|---|---|---|---|---|
| 1 - Group 1 | IC 1000 | None | ILD 1300 | 7508 | 3774 | 15 |
| 2 - Group 1 | IC 1000 | None | ILD 1300 | 6955 | 3180 | 14.1 |
| 3 - Group 1 | IC 1000 | None | ILD 1300 | 4168 | 4044 | 18.5 |
| 4 - Group 1 | IC 1000 | None | ILD 1300 | 6963 | 4323 | 17.5 |
| 5 - Group 1 | IC 1000 | None | ILD 1300 | 6808 | 3494 | 15.4 |
| 6 - Group 2 | IC 1000 | .3 grams | ILD 1300 | 7034 | 3750 | 16 |
| 7 - Group 2 | IC 1000 | .3 grams | ILD 1300 | 7335 | 3458 | 14.3 |
| 8 - Group 2 | IC 1000 | .3 grams | ILD 1300 | 8124 | 4595 | 15.2 |
| 9 - Group 2 | IC 1000 | .3 grams | ILD 1300 | 8054 | 3736 | 13 |
| 10 - Group 3 | IC 1000 | 3 grams | ILD 1300 | 7643 | 4137 | 15.4 |
| 11 - Group 3 | IC 1000 | 3 grams | ILD 1300 | 7713 | 3785 | 14.4 |
| 12 - Group 3 | IC 1000 | 3 grams | ILD 1300 | 7829 | 3803 | 15.3 |
| 13 - Group 3 | IC 1000 | 3 grams | ILD 1300 | 8326 | 3668 | 14.6 |

Table 9 shows the results of Table 8 averaged by group number. As is shown by the decrease in percent standard deviation from the control group standard deviation, the uniformity of the planarized wafer surface is improved by the addition of EDP in the slurry. Further, as indicated by the average thickness removed, the rate of removal over this period of time was not reduces by the addition of EDP to the slurry, but rather the rate of removal was actually increased.

TABLE 9

Start to Final Planarization (4.5 Minutes) - Group Averaged

| Wafer Group No. | Pads | Amount of EDP added per 5000 ml | Slurry | Average Thickness Removed (Å) | Average Range (Å) | % STD |
|---|---|---|---|---|---|---|
| Group 1 | IC 1000 | None | ILD 1300 | 7023 | 3763 | 16.1 |
| Group 2 | IC 1000 | .3 grams | ILD 1300 | 7637 | 3885 | 14.6 |
| Group 3 | IC 1000 | 3 grams | ILD 1300 | 7878 | 3848 | 14.9 |

If the control group had been planarized to a level substantially equivalent to the other groups, the percent standard deviation would have increased for the control group resulting in an even more pronounced showing of improvement for the wafers planarized with EDP added to the slurry.

Although the invention has been described with particular reference to a preferred embodiment thereof, variations and modifications of the present invention can be made within a contemplated scope of the following claims as is readily known to one skilled in the art.

What is claimed is:

1. A planarization method comprising the steps of:

providing a wafer surface;

positioning a pad for contact with the wafer surface; and planarizing the wafer surface using the pad and a slurry, the slurry including a dispersant, the dispersant being one of any micellar forming surfactants.

2. The method according to claim 1, wherein the dispersant is preferably a short chain diprotic acid having 6 or less carbons connecting acid groups.

3. The method according to claim 1, wherein the wafer surface is one of a nonplanar or substantially planar wafer surface.

4. A planarization method comprising the steps of:

providing a wafer surface;

positioning a pad for contact with the wafer surface over a contact area of the surface; and planarizing the wafer surface using the pad and a slurry, the slurry including:

a slurry component including an abrasive component and a chemically interactive component that interacts with the surface, the slurry component when used alone in a planarization of the wafer surface resulting in a wafer thickness uniformity having a first standard deviation and a first rate of removal of material from the wafer surface; and a dispersant component of an amount sufficient to reduce the first standard deviation to a second standard deviation lower than the first standard deviation when the planarization of the wafer surface is performed with the slurry including the slurry component and the dispersant component having a second rate of removal substantially equivalent to the first rate of removal, wherein the dispersant component is one of any micellar forming surfactants.

5. The method according to claim 4, wherein the dispersant component is preferably a diprotic acid having 6 or less carbons connecting acid groups.

6. The method according to claim 4, wherein the slurry is transported to the center of the contact area during the planarization step such that the slurry is substantially uniformly distributed over the contact area.

7. The method according to claim 4, wherein the wafer surface is one of a nonplanar or substantially planar wafer surface.

8. A planarization method comprising:

providing an oxide layer having a surface;

positioning a pad for contact with the surface; and planarizing the oxide layer using the pad and a slurry, the slurry including a dispersant, the dispersant being one of any micellar forming surfactants.

9. The method according to claim 8, wherein the dispersant is preferably a short chain diprotic acid having 6 or less carbons connecting acid groups.

* * * * *

UNITED STATES PATENT AND TRADEMARK OFFICE
CERTIFICATE OF CORRECTION

PATENT NO.   : 6,060,395
DATED        : May 9, 2000
INVENTOR(S)  : John Skrovan and Karl M. Robinson It is certified that error appears in the above-identified patent and that said Letters Patent is hereby corrected as shown below:

Column 4,
Line 4, please delete "b) and insert -- by --;
Line 19, after "3", please insert --. -- ;
Line 53, please delete "Furthers" and insert -- Further, --;

Column 5,
Line 26, please delete "and-the" and insert --and the --;

Column 6,
Line 8, please delete "3-effectively" and insert -- 34 effectively -- ;
Line 12, please delete "distributes" and insert -- distributed --;

Column 7,
Line 46, after "results", insert-- show --;
Line 51, please delete "472." and insert -- 472, -- ;
Line 66, after "pad", please insert --,--;

Column 8,
Line 45, please delete "slur" and insert -- slurry --;

Column 9,
Line 22, please delete "4" and insert -- 3 -- ;

Table 4,
Line 56, please delete "Average" in Column 5;
Line 56, please insert -- Average -- in Column 6;

UNITED STATES PATENT AND TRADEMARK OFFICE
CERTIFICATE OF CORRECTION

PATENT NO.   : 6,060,395
DATED        : May 9, 2000
INVENTOR(S)  : John Skovan and Karl M. Robinson It is certified that error appears in the above-identified patent and that said Letters Patent is hereby corrected as shown below:

Column 10,
Line 59, please delete "b)" and insert -- by -- ; and

Column 11,
Line 66, please delete "reduces" and insert-- reduced --.

Signed and Sealed this

Eleventh Day of September, 2001

*Attest:*

NICHOLAS P. GODICI
*Attesting Officer*   *Acting Director of the United States Patent and Trademark Office*